(12) United States Patent
Short

(10) Patent No.: US 7,102,344 B1
(45) Date of Patent: Sep. 5, 2006

(54) CIRCUIT TESTER

(76) Inventor: Barry W. F. Short, 180 Waterhouse Lane, Shirley, Southhampton, Hampshire (GB)

( * ) Notice: Subject to any disclaimer, the term of this patent is extended or adjusted under 35 U.S.C. 154(b) by 0 days.

(21) Appl. No.: 11/139,001

(22) Filed: May 27, 2005

(51) Int. Cl.
*G01R 31/04* (2006.01)
*G01R 19/145* (2006.01)
*G08B 21/00* (2006.01)

(52) U.S. Cl. .......................... 324/66; 324/508; 340/656

(58) Field of Classification Search ............... None
See application file for complete search history.

(56) References Cited

U.S. PATENT DOCUMENTS

| | | | |
|---|---|---|---|
| D211,088 S | 5/1968 | Schwartz et al. | |
| 3,753,088 A | 8/1973 | Ettelman | |
| 3,800,214 A | 3/1974 | O'Flynn | |
| 3,816,827 A | 6/1974 | Lynn, Jr. | |
| 3,902,170 A | 8/1975 | McElroy | |
| D236,594 S | 9/1975 | Smith, Jr. | |
| D251,183 S | 2/1979 | Howard | |
| 4,259,635 A | 3/1981 | Triplett | |
| 4,588,862 A | 5/1986 | Grabowy | |
| 4,725,772 A | 2/1988 | Peak | |
| 4,776,018 A * | 10/1988 | Cordier | 381/336 |
| 4,945,346 A | 7/1990 | Schmiemann | |
| 4,963,854 A | 10/1990 | Stuecker | |
| 5,331,283 A | 7/1994 | Sheldon | |
| 5,564,943 A * | 10/1996 | Weiss | 439/502 |
| 5,828,765 A * | 10/1998 | Gable | 381/386 |
| 6,020,822 A * | 2/2000 | Marshall | 340/654 |
| 6,246,225 B1 | 6/2001 | Schaefer | |
| 6,748,096 B1 * | 6/2004 | Chuang | 381/395 |

\* cited by examiner

*Primary Examiner*—Ernest Karlsen
(74) *Attorney, Agent, or Firm*—Donald R. Schoonover

(57) ABSTRACT

A circuit testing device includes a housing that is sized and adapted to securely fit into a light bulb socket. The device includes spring-loaded prongs which securely hold the housing in place in the socket until it is desired to remove the testing device. The testing device generates an audible signal when power is applied to the socket to alert a user that power is present, even if the user is located at a distance from the point of test.

1 Claim, 1 Drawing Sheet

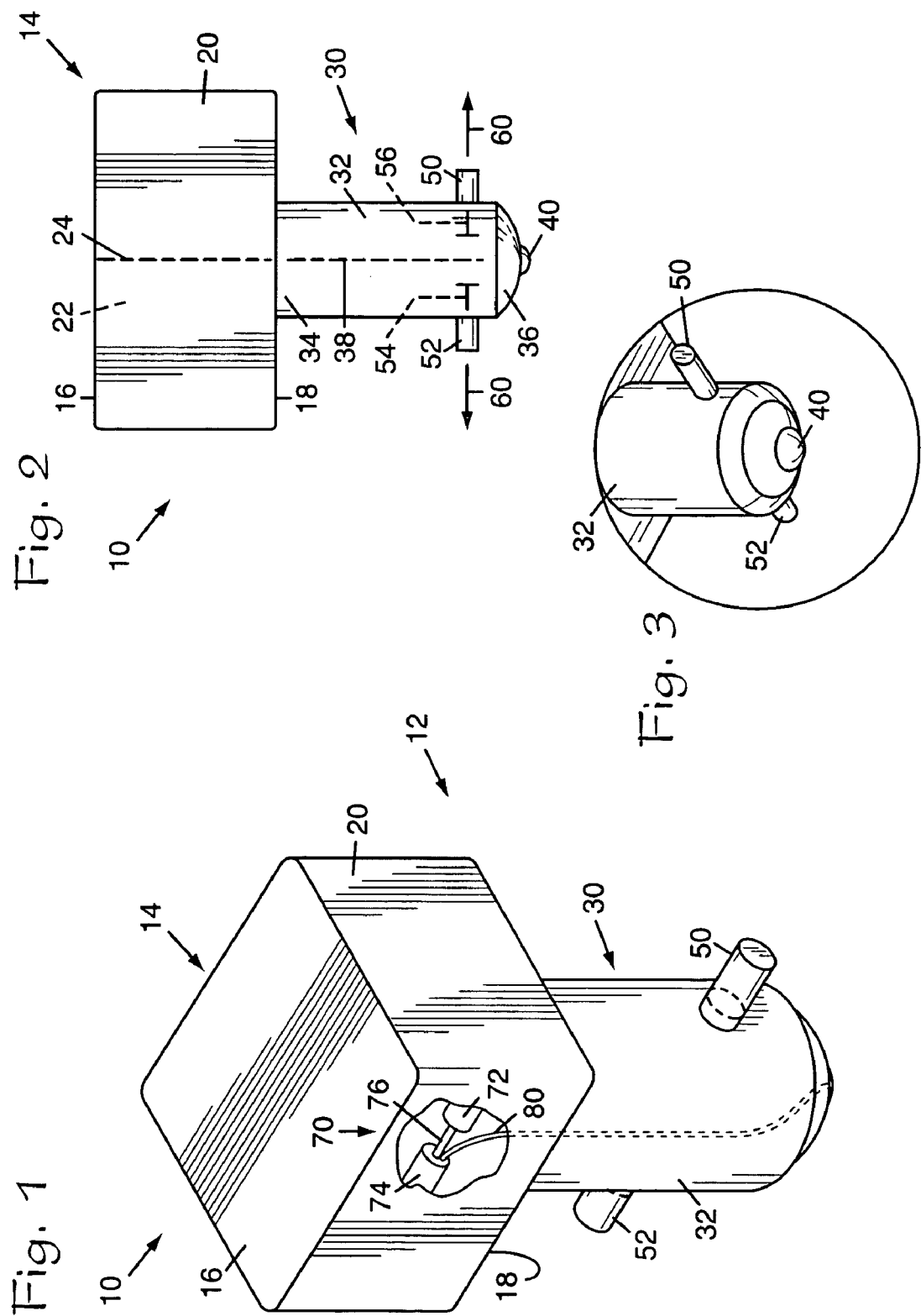

CIRCUIT TESTER

BACKGROUND OF THE INVENTION

1. Field of the Invention

The present invention relates to means for testing electrical circuits, and more particularly to testing for power in electrical circuits.

2. Description of the Related Art

In the service wiring of virtually any modern commercial or residential building, an incoming AC power line is connected to a fuse box or other circuit-breaking means for protection in the event a circuit is loaded beyond a desired amperage. Normally the structure is wired with a plurality of separate, electrically distinct circuits each connected to a different fuse or circuit breaker. Each circuit may, and commonly does, include a number of receptacles or other outlets for selectively connecting the items to receive electrical power from the circuit.

Many situations arise which make it necessary to determine in which circuit a particular outlet is connected, where this is not otherwise indicated. This can be a very time-consuming operation, especially when it must be performed by one person working alone. In many cases the fuse box or circuit breakers will be located at a considerable distance from the outlet of the circuit being traced, often on a different floor of a building. Many trips back and forth between the outlet and fuse/breaker box may be required before the proper circuit is identified.

Another common situation which arises, for example, during wiring operations in buildings and elsewhere, is the need to determine whether two conductors are electrically connected. That is, it must be determined whether circuit continuity exists between two conductors where no external power is being provided thereto.

Therefore, there is a need for a device for testing the continuity or integrity of a circuit which can be used by a single worker.

Still further, it is necessary for any circuit continuity tester to remain securely in place during a test. If the tester becomes loose, its reliability will be undermined. Many circuit testers are used in conditions that may tend to dislodge such devices, such as by vibration or the like.

Therefore, there is a need for a device for testing the continuity or integrity of a circuit which will remain securely in place.

Further to the above, while a device must be securely held in place, it should be easily placed and removed when desired. Otherwise, it will be too cumbersome to use and will not be accepted by workers.

Therefore, there is a need for a device for testing the continuity or integrity of a circuit which will remain securely in place but which can be easily placed and/or removed when desired.

PRINCIPAL OBJECTS OF THE INVENTION

It is a main object of the present invention to provide a device for testing the continuity or integrity of a circuit which can be used by a single worker.

It is another object of the present invention to provide a device for testing the continuity or integrity of a circuit which will remain securely in place.

It is another object of the present invention to provide a device for testing the continuity or integrity of a circuit which will remain securely in place but which can be easily placed and/or removed when desired.

SUMMARY OF THE INVENTION

These, and other, objects are achieved by a circuit continuity tester that includes a housing that is sized and adapted to snugly fit into a light bulb socket. Spring-loaded prongs on the housing make it easy to insert the housing into the light bulb socket, but will securely hold the housing in place once it is in the socket. The housing can be easily removed from the socket by manipulating it to depress at least one of the prongs into the housing against the bias of a spring. The tester includes a circuit that generates an audible signal when power is applied to the socket so a user will be alerted to the presence of power at the socket, even if the user is located at a distance from the socket.

Using the tester embodying the present invention will permit a user to test circuits even if the user is located some distance away from the point of a test. The tester is easily inserted into a test location and will remain in place until it is desired to remove it, at which time it is easily removed.

BRIEF DESCRIPTION OF THE DRAWING FIGURES

FIG. 1 is a perspective view of a circuit integrity tester embodying the present invention.

FIG. 2 is an elevational view of the circuit integrity tester shown in FIG. 1.

FIG. 3 is a detail view of the tip of the circuit integrity tester shown in FIG. 1.

DETAILED DESCRIPTION OF THE PREFERRED EMBODIMENT

Other objects, features and advantages of the invention will become apparent from a consideration of the following detailed description and the accompanying drawings.

Referring to the Figures, it can be understood that the present invention is embodied in a circuit tester 10 that achieves the above-stated objectives.

Circuit tester 10 comprises a housing 12 which has a first section 14 that is a top section when housing 12 is in use, with the use position being shown in FIG. 1. Top section 14 includes a first surface 16 that is a top surface when housing 12 is in use and a second surface 18 that is a bottom surface when housing 12 is in use. A plurality of side walls, such as side wall 20, connect first surface 16 to second surface 18.

An interior volume 22 is defined by first surface 16, second surface 18, and the side walls 20 of first section 14 of housing 12. A longitudinal axis 24 extends between first surface 16 and second surface 18 of housing 12.

Housing 12 further includes a second section 30 that is a bottom section when housing 12 is in use. Bottom section 30 includes a tubular wall 32 which has a first end 34 fixed to second surface 18 of housing 12, a second end 36 that is spaced apart from second surface 18 of housing 12, and a longitudinal axis 38 that extends between first end 34 and second end 36 of the tubular wall 32 and is co-linear with longitudinal axis 24 of first section 14 of housing 12.

An electrically conductive contact 40 is located on second end 36 of tubular wall 32 and makes electrical contact with an electrical conductive portion of a light socket when the housing 12 is placed into the light socket.

Two spring-biased prongs 50 and 52 are mounted on tubular wall 32. The prongs 50, 52 are each positioned at a location spaced apart from second end 36 of tubular wall 32. The prongs 50, 52 extend outwardly from the tubular wall 32 and are biased by springs 54 and 56 in direction 60 that is outwardly directed from the tubular wall 32. The prongs 50, 52 are movable between a deployed position, shown in solid lines in FIG. 2, and a release position, shown in broken lines in FIG. 1, which shows the prong moved partially into the tubular wall 32. Movement of the prongs 50, 52 from the deployed position to the release position is toward the tubular wall 32 against the bias of springs 54 and 56.

An electrical circuit 70 is located in interior volume 22 of first section 14 of housing 12. Electrical circuit 70 includes a sound generator 72, a power source 74, and a switch mechanism 76 which connects sound generator 72 to power source 74 to energize the sound generator 72 when power is applied to switch mechanism 76. The exact details of electrical circuit 70 are not important to the present invention and the electrical circuit is of the type known to circuit designers, such as disclosed in the literature, such as U.S. Pat. No. 6,246,225, the disclosure of which is incorporated herein by reference. Accordingly, the exact details of electrical circuit 70 will not be presented in detail.

An electrical lead 80 electrically connects electrically conductive contact 40 on tubular wall 32 to electrical circuit 70 to apply power to switch mechanism 76 when power is applied to the electrically conducive contact 40.

Operation of tester 10 can be understood from the teaching of the foregoing disclosure. The tester 10 is placed into a light bulb-type socket by twisting and manipulating the housing 12 to depress the prongs 50, 52 into the tubular housing 12 against the bias of the springs 54, 56. Once the housing 12 is properly seated in the socket, the prongs 50, 52 will securely engage the socket to hold tester 10 securely in place. Once the tester 10 is in place, contact 40 will be in electrical contact with a power terminal of a circuit being tested. When power is applied to the circuit being tested, that power will be applied to switch mechanism 76 via lead 80 and power will be applied, via switch mechanism 76, to sound generator 72 either from lead 80 or from power source 74, or both, whichever is proper for the circuit design associated with circuit 70. The sound generated by sound generator 72 will alert a user that power is available at the circuit being tested, even if the user is spaced at a distance away from tester 10. Tester 10 is removed from the socket by twisting the housing 12 to depress at least one of the prongs 50, 52 into the tubular housing 12 to release tester 10 from the socket. The tester 10 is then removed from the socket.

It is understood that while certain forms of the present invention have been illustrated and described herein, it is not to be limited to the specific forms or arrangements of parts described and shown.

What is claimed and desired to be covered by Letters Patent is:

1. A circuit tester comprising:
a) a housing having
  (1) a first section that is a top section when said housing is in use, the top section of said housing including
    (A) a first surface that is a top surface when said housing is in use,
    (B) a second surface that is a bottom surface when said housing is in use,
    (C) a plurality of side walls connecting the first surface of the first section of said housing to the second surface of the first section of said housing,
    (D) an interior volume defined by the first surface, the second surface and the side walls of the first section of said housing, and
    (E) a longitudinal axis which extends between the first surface of the first section of said housing and the second surface of the first section of said housing, and
  (2) a second section that is a bottom section when said housing is in use, the bottom section of said housing including
    (A) a tubular wall which has a first end fixed to the second surface of the first section of said housing, a second end which is spaced apart from the second surface of the first section of said housing, and a longitudinal axis that extends between the first end of the tubular wall and the second end of the tubular wall and is co-linear with the longitudinal axis of the first section of said housing,
    (B) an electrically conductive contact on the second end of the tubular wall, and
    (C) two spring-biased prongs mounted on the tubular wall at a location spaced apart from the second end of the tubular wall, the prongs extending outwardly from the tubular wall, the prongs being biased in a direction that is outward from the tubular wall and movable between a deployed position and a release position, with movement from the deployed position to the release position being toward the tubular wall against the spring bias;
c) an electrical circuit located in the first section of said housing, said electrical circuit including a sound generator, a power source and a switch mechanism which connects the sound generator to the power source to energize the sound generator when power is applied to the switch mechanism; and
d) an electrical lead electrically connecting the electrically conductive contact on the second end of the tubular wall to the switch mechanism to apply power to the switch when power is applied to the electrically conducive contact.

* * * * *